United States Patent [19]

Hamamoto et al.

[11] Patent Number: 5,261,962
[45] Date of Patent: Nov. 16, 1993

[54] PLASMA-CHEMICAL VAPOR-PHASE EPITAXY SYSTEM COMPRISING A PLANAR ANTENNA

[75] Inventors: Kazutoshi Hamamoto; Satoshi Uchida; Masayoshi Murata; Yoshiaki Takeuchi; Masaru Kodama, all of Nagasaki, Japan

[73] Assignee: Mitsubishi Jukogyo Kabushiki Kaisha, Tokyo, Japan

[21] Appl. No.: 893,010

[22] Filed: Jun. 3, 1992

[30] Foreign Application Priority Data

Jun. 5, 1991 [JP] Japan .................. 3-134259

[51] Int. Cl.⁵ .......................................... C23C 16/50
[52] U.S. Cl. .................................. 118/723; 118/725
[58] Field of Search ............... 118/723, 725; 156/345; 315/111.21, 111.51

[56] References Cited

U.S. PATENT DOCUMENTS

| | | | |
|---|---|---|---|
| 4,017,404 | 4/1977 | Habeger | 204/164 X |
| 4,058,638 | 11/1977 | Morton | 427/573 |
| 4,115,184 | 9/1978 | Poulsen | 156/646 X |
| 4,526,673 | 7/1985 | Little et al. | 204/192.35 |
| 4,725,449 | 2/1988 | Ehlers et al. | 427/545 |
| 4,729,341 | 3/1988 | Fournier et al. | 118/723 |
| 4,844,775 | 7/1989 | Keeble | 118/728 X |
| 4,948,458 | 8/1990 | Ogle | 118/728 X |
| 5,055,319 | 10/1991 | Bunshah et al. | 427/567 |
| 5,091,049 | 2/1992 | Campbell et al. | 427/571 X |

FOREIGN PATENT DOCUMENTS

| | | |
|---|---|---|
| 3011686 | 10/1980 | Fed. Rep. of Germany . |
| 60-104134 | 6/1985 | Japan . |
| 62-291922 | 12/1987 | Japan . |

OTHER PUBLICATIONS

Sze, *VLSI Technology*, 1983, pp. 120-127.
Webster's II New Riverside University Dictionary, 1988, p. 970.

Primary Examiner—Tom Thomas
Assistant Examiner—Jonathan D. Baskin
Attorney, Agent, or Firm—Wenderoth, Lind & Ponack

[57] ABSTRACT

A plasma-chemical vapor-phase epitaxy system or a chemical vapor deposition (CVD) system can produce a large thin film of good quality. The CVD system includes a vacuum container having a quartz glass window, a substrate disposed within the vacuum container as opposed to the window, an antenna type discharge electrode disposed outside of the vacuum container as opposed to the window, and a high-frequency power supply for feeding electric power to the same electrode. In this way, by disposing an electrode outside of a container and exciting the reaction gas with high-frequency electromagnetic waves, a large thin film of good quality can be formed.

4 Claims, 6 Drawing Sheets

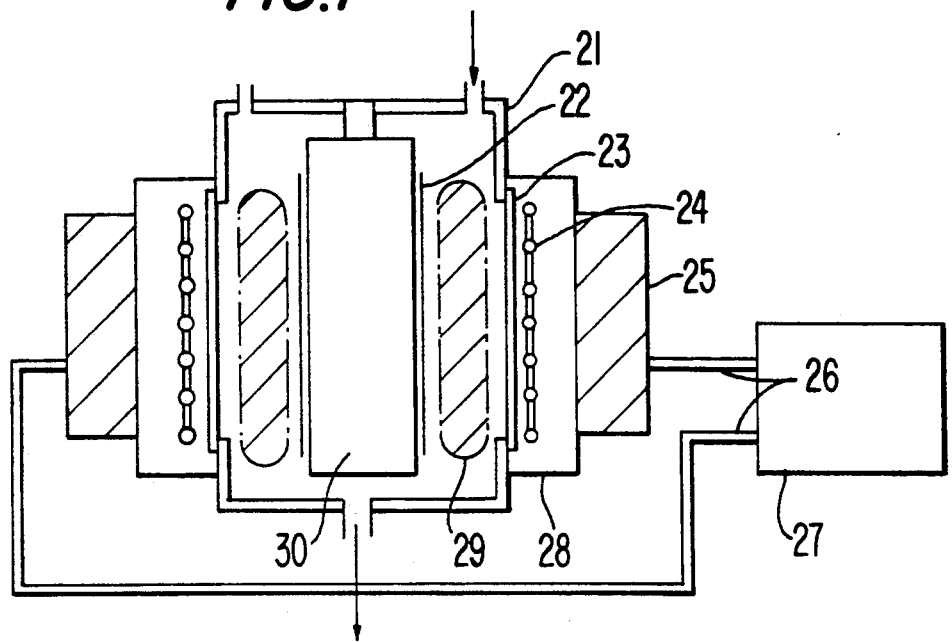
FIG. I
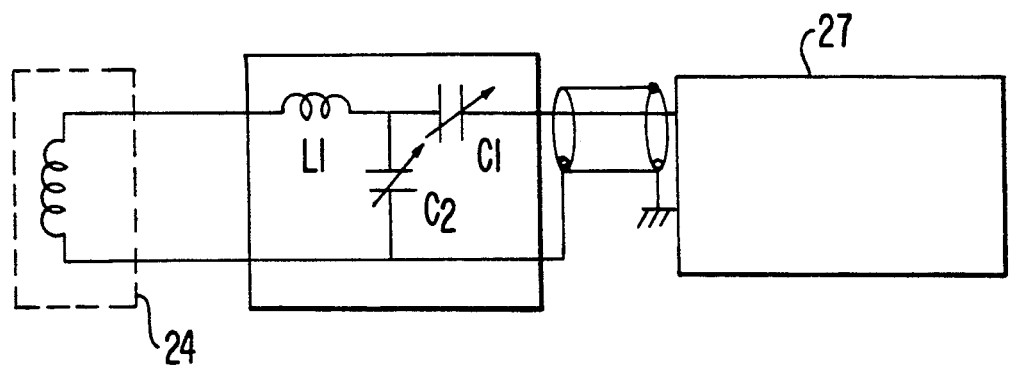
FIG. 3

FIG.4
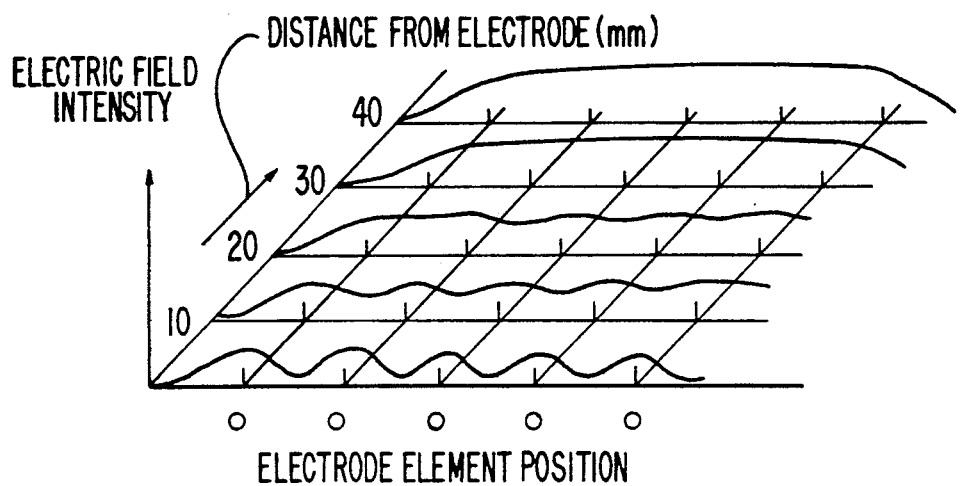
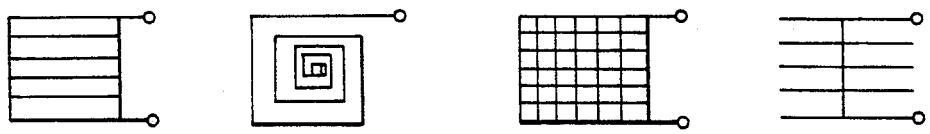
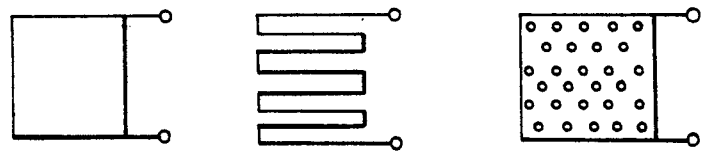

PLASMA-CHEMICAL VAPOR-PHASE EPITAXY SYSTEM COMPRISING A PLANAR ANTENNA

BACKGROUND OF THE INVENTION

1. Field of the Invention

The present invention relates to a plasma-chemical vapor-phase epitaxy system, i.e., a chemical vapor deposition system (hereinafter abbreviated as CVD system) which is suitable for the manufacture of a thin film for use in various electronic devices such as amorphous silicon solar cells, thin film semiconductors, and photo-sensors, as well as for use as semiconductor protective films, etc.

2. Description of the Prior Art

One example of a parallel plate type of plasma CVD system in the prior art is illustrated in FIG. 10. In this system, substrates 1 are disposed as opposed to a plate type RF (Radio-Frequency) electrode 5 equipped within a vacuum container 7.

Reaction gas 2 is made to pass through the RF electrode 5, and when an RF voltage is applied from an RF power supply 3 to the RF electrode 5, plasma is produced. Owing to this plasma, a reaction occurs and a thin film is formed on the substrates 1 as a result of CVD. In this figure, reference numeral 4 designates a shield, numeral 6 designates a substrate holder, numeral 8 designates a heater for heating substrates, and numeral 9 designates a thermocouple for detecting a temperature.

Also, one example of an RF induction coupling type plasma CVD system in the prior art is shown in FIG. 11. In this system, a quartz discharge tube 13 is mounted above a vacuum container 7a coaxially with the container, and around the discharge tube 13 is wound a discharging coil 12. In addition, substrates 1a are disposed on a substrate holder 6a at the center of the vacuum container 7a. A heater 8 heats the substrate, and a thermocouple 9 detects a temperature.

Reaction gas 2 is introduced from above the quartz discharge tube 13, and when electric power is applied from an RF power supply 3 to the discharging coil 12, plasma is produced within the discharging tube 13. Therefore, a thin film is formed on the substrates 1a as a result of CVD.

One example of a photo-CVD system in the prior art is illustrated in FIG. 12. A substrate 1b is disposed nearly at the center of a vacuum container 7b, and a light source 14 is disposed above the substrate 1b with a quartz glass window 15 interposed therebetween.

Reaction gas introduced into the vacuum container 7b is made to react by the energy of light radiated from the light source 14, whereby a thin film is formed on the substrate 1b as a result of CVD.

A characteristic property of the above-mentioned RF parallel plate type plasma CVD system in the prior art is that formation of a film having a large area of about 70 cm square is possible, and this system belongs to the most orthodox type of systems. However, due to the fact that the electrode is placed within the vacuum container, this system is subject to problems such as the release of impurities from the electrode and the production of particles caused by a peeling of films. In the case of the RF induction-coupling type plasma CVD system, although contaminants are not produced because of the fact that the discharging coil is disposed outside of the vacuum container, it is difficult to design the system to be capable of effecting deposition over a large area. Hence, it is not suitable as a system for mass-production, and it is solely used for research purposes. Although the photo-CVD system is not provided with an electrode and hence it can produce a film of very high quality, it presents a problem in that because a film is deposited on the glass window, light cannot pass through the window and formation of a film becomes impossible.

The above-described problems in the heretofore known CVD systems can be summarized as follows:

(1) In the case where an electrode for performing RF discharge is present in a vacuum, impurities from the electrode and a peeling of films would adversely affect a film on a substrate.

(2) A system, in which excitation energy is supplied from the outside of the vacuum chamber by a coil instead of an RF discharging electrode, is difficult to adapt to large-area film formation.

(3) In a photo-CVD system, although a film of high quality can be formed, formation of the film becomes impossible when the glass plate reaches an opaque state.

SUMMARY OF THE INVENTION

It is therefore one object of the present invention to provide an improved plasma CVD system in which particles and impurities will not contaminate a formed thin film, and which makes it possible to form a thin film having a large area.

According to the present invention, there is provided a plasma-chemical vapor-phase epitaxy system, comprising a vacuum container having a window made of a dielectric, a substrate disposed within the vacuum container as opposed to the window, antenna type discharge means disposed outside of the vacuum container as opposed to the window, and a high-frequency power supply for supplying electric power to the antenna type discharge means.

Further, a coil may surround the vacuum container with its axis oriented at a right angle to the axis of the antenna type discharge means, and an A.C. power supply supplies electric power to the coil.

When reaction gas is introduced into the vacuum container and electric power is fed to the antenna type discharge means, an electromagnetic wave is radiated from the antenna type discharge means towards the substrate. Due to this electromagnetic wave, plasma is produced within the vacuum container, whereby the reaction gas reacts, and a thin film is formed on the substrate as a result of CVD.

In this way, a thin film can be formed on a large substrate, and because no electrode is located within the vacuum container, impurities from the electrode will not contaminate formed film nor will a film peel.

When an electric current is fed from the A.C. power supply to the coil, an A.C. magnetic field is generated in the axial direction of the coil. Since this magnetic field is generated in a direction oriented at a right angle to the electric field of the electromagnetic wave, the plasma produced by the electromagnetic wave is made to drift, and so, a more uniform thin film is formed on the substrate.

The above-mentioned and other objects, features and advantages of the present invention will become more apparent by referring to the following description of a number of preferred embodiments of the invention taken in conjunction with the accompanying drawings.

BRIEF DESCRIPTION OF THE DRAWINGS

In the accompanying drawings:

FIG. 1 is a schematic view in section of a first preferred embodiment of a CVD system according to the present invention;

FIG. 3 is a circuit diagram of an electrode and an RF tuning circuit in the same preferred embodiment;

FIG. 4 is a three-dimensional representation of characteristics of the same preferred embodiment;

FIGS. 5(a)-5(g) are schematic diagrams of examples of an electrode in the same preferred embodiment;

DETAILED DESCRIPTION OF THE PREFERRED EMBODIMENTS

Figure 6:
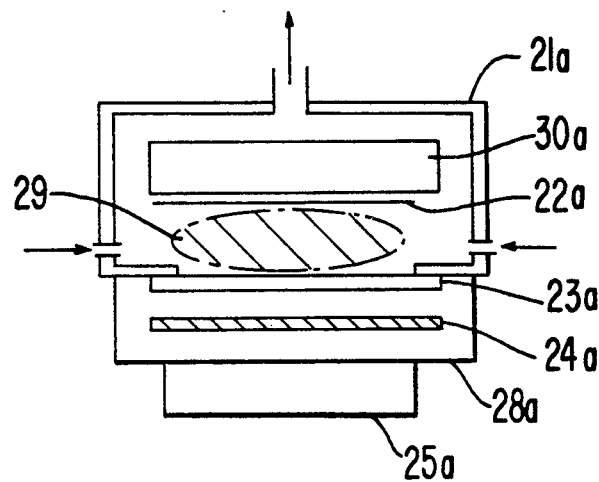
FIG. 6 is a schematic diagram in section of a second preferred embodiment according to the present invention.

Now, a first preferred embodiment of the present invention will be explained with reference to FIGS. 1 through 5. It is to be noted that like parts already described in connection with the systems in the prior art will not be further described but only portions relevant to this invention will be mainly described.

In FIG. 1, a vacuum container 21 has quartz glass windows 23 on its opposite sides. In addition, at a central portion of the vacuum container 21 is provided a heater 30 for heating substrates, which has surfaces parallel to the windows 23. Furthermore, on the opposite side surfaces of the heater 30 are substrates, which have surfaces parallel to the windows 23. Furthermore, on the opposite side surfaces of the heater 30 are disposed substrates 22 which are nearly as large as the windows 23.

Also, in the proximity of the windows 23 at the outside thereof are provided antenna type discharging electrodes 24 with their axes extending nearly vertically. The electrodes 24 are respectively covered by high-frequency shield boxes 28 made of aluminum. Furthermore, the antenna type discharging electrodes 24 are respectively connected to a radio-frequency (RF) power supply 27 via radio-frequency (RF) tuning circuits 25.

Figure 2:
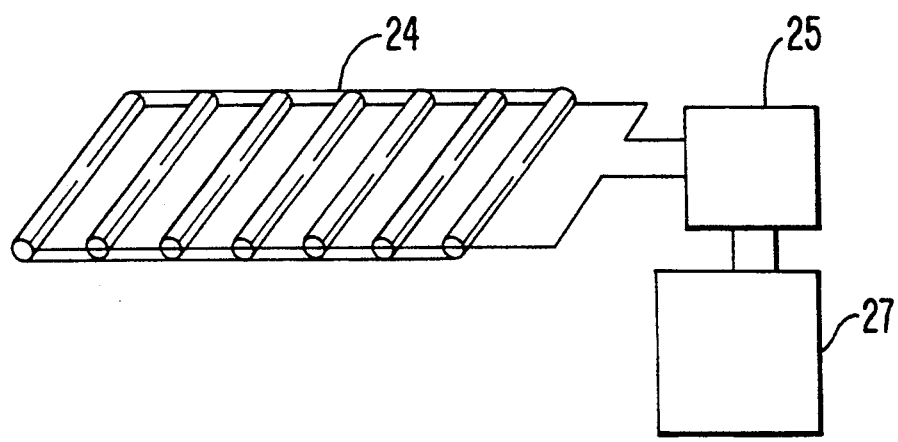
FIG. 2 is a perspective view of an antenna type discharging electrode in the same preferred embodiment.

In the antenna type discharging electrode 24, as shown in detail in FIG. 2, conductor elements are disposed in the shape of a ladder having an external size nearly equal to that of the windows 23, and RF power is fed to the conductor elements via the RF tuning circuit 25. An electric circuit diagram of this portion of the system is shown in FIG. 3.

In the above-described embodiment, when a thin film of amorphous silicon is to be formed, for instance, on a substrate 22 (a wafer of glass, silicon or the like), $SiH_4$ gas is supplied into the vacuum container 21. The pressure in the vacuum container 21 is maintained at about 0.1-1 Torr, and the substrate 22 is heated by the heater 30 up to a predetermined temperature. Then, RF power is fed from an RF power supply 27 of 13.56 MHz to the antenna type discharging electrode 24 via the RF tuning circuit 25. Then an electromagnetic wave having an electric field distribution, which becomes uniform in a direction from the electrode 24 towards the substrate 22 as shown in FIG. 4, is generated. More particularly, while the electric field has an uneven distribution in the vicinity conductor elements of the electrode 24, the electric field distribution becomes more flat the farther one goes from the centers of the conductor elements towards the substrate 22. Owing to this electric field having a flat distribution, uniform plasma 29 is produced within the container 21. Hence, a uniform thin film of amorphous silicon is formed on the substrate 22 as a result of CVD.

In this system, the RF shield boxes 28 serve to feed electromagnetic waves radiated from the electrodes 24 into the container 21 and to prevent them from leaking out. Also, the RF tuning circuits 25 serve to efficiently feed the electric power generated by the RF power supply 27 to the electrodes 24. In this way, a thin film can be formed on the large substrates 22. Moreover, owing to the fact that an electrode is not present within the vacuum container 21, impurities released from the electrodes won't contaminate the film nor does a peeling of a film occur. Also, since electromagnetic waves are utilized, the CVD system is not adversely affected even if the quartz glass windows were to become opaque.

It is to be noted that a ladder type, spiral type, net type ribs type, flat plate type, zig-zag type, punched plate type, etc of electrode, as shown in FIGS. 5(a) through 5(g), could be employed as the discharging electrode 24.

Next, a second preferred embodiment of the present invention will be described with reference to FIG. 6.

This embodiment can be construed as the left-half or right-half of the first preferred embodiment arranged horizontally. That is, a quartz glass window 23a is disposed at the bottom of a vacuum container 21a. In this figure, reference numeral 22a designates a substrate, numeral 24a designates an antenna type electrode, numeral 25a designates an RF tuning circuit, numeral 28a designates an RF shield box and numeral 30a designates a heater.

Since operations and advantages of this embodiment are almost the same as those of the first preferred embodiment, a further explanation thereof will be omitted.

Figure 7:
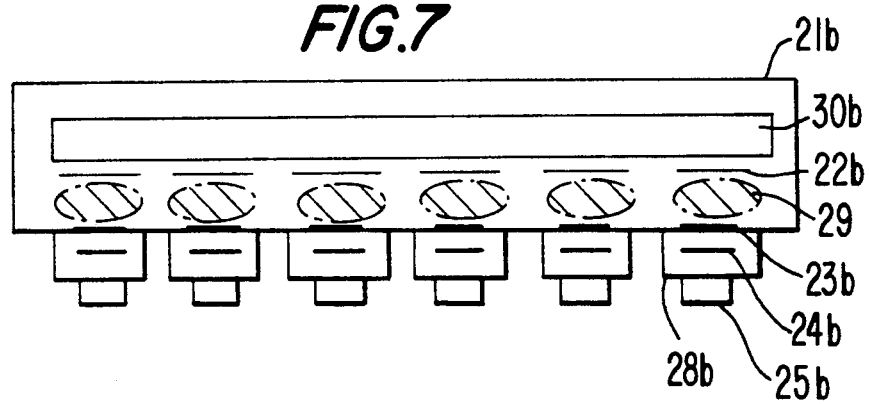
FIG. 7 is a schematic diagram in section of a third preferred embodiment according to the present invention.

Now a third preferred embodiment of the present invention will be described with reference to FIG. 7.

This embodiment is substantially an integration of a number of the systems of the second preferred embodiment. In this figure, reference numeral 21b designates a vacuum container, numeral 30b designates a heater, numeral 22b designates a plurality of substrates, numeral 23b designates a plurality of quartz glass windows provided at the bottom of the vacuum container 21b, numeral 24b designates antenna type discharging electrodes provided at the respective windows, numeral 28b designates RF shield boxes surrounding the respective discharging electrodes, and numeral 25b designates RF tuning circuits for the respective discharging electrodes. The operations and advantages of this preferred embodiment are almost the same as those of the second preferred embodiment. In this way, it becomes possible to form films simultaneously on a plurality of substrates 22b.

Figure 8:
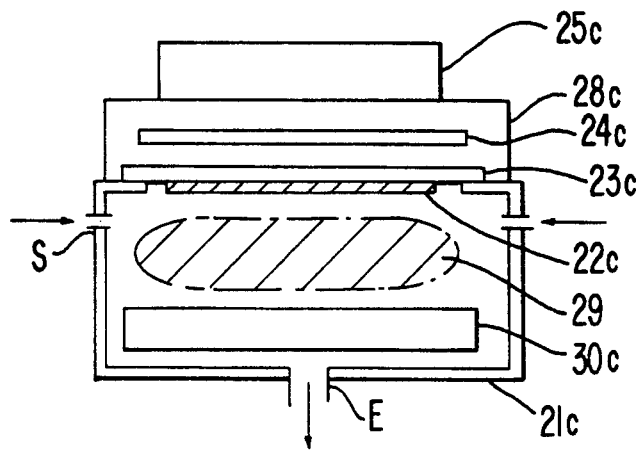
FIG. 8 is a schematic diagram in section of a fourth preferred embodiment according to the present invention.

A fourth preferred embodiment of the present invention will be described with reference to FIG. 8. In this embodiment, a quartz glass window 23c is provided at the top of a vacuum container 21c. A substrate 22c is disposed on an inner surface of the window 23c. Reference numeral 24c designates an antenna type discharging electrode, 25c an RF tuning circuit and 28c a high-frequency shield box. Furthermore, an infrared ray heater 30c is provided under the substrate 22c as opposed thereto to heat a surface of the substrate 22c which is to have a film formed thereon. It is to be noted that reaction gas supply ports S are provided at the bottom so that dust will not attach to the substrate 22c. The other operations and advantages of this embodiment are similar to those of the second preferred embodiment.

Figure 9:
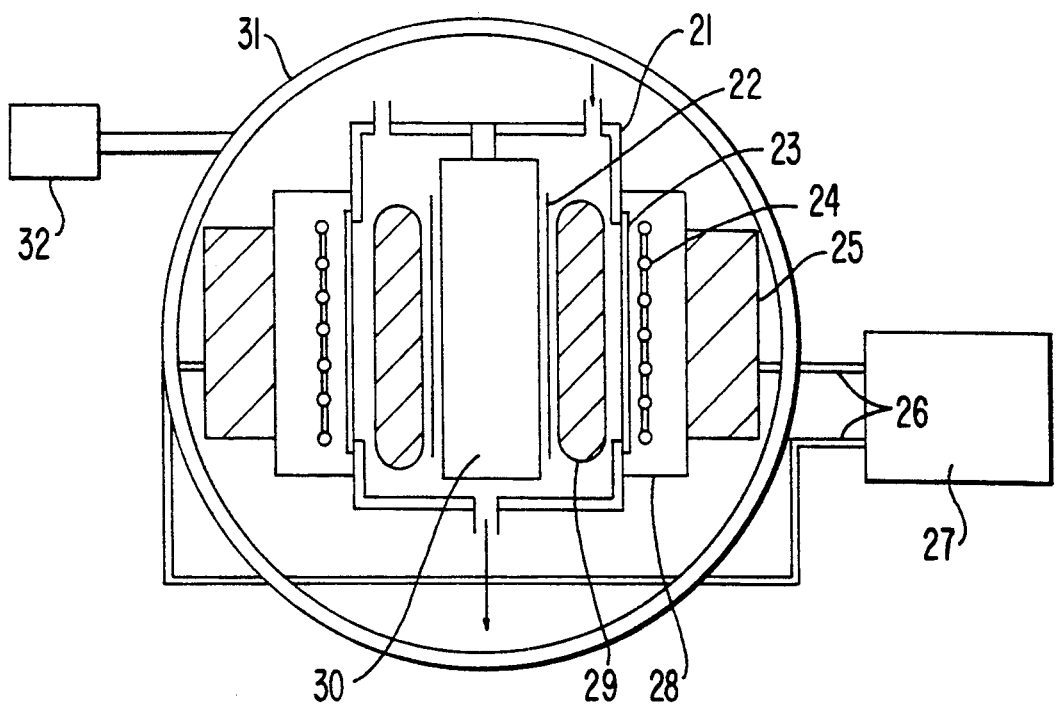
FIG. 9 is a schematic diagram in section of a fifth preferred embodiment according to the present invention.
Figure 10:
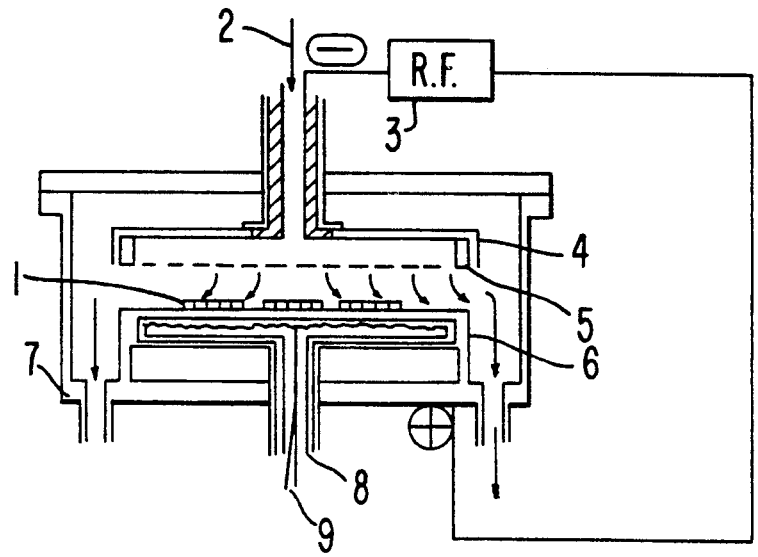
FIG. 10 is a schematic diagram in section of a parallel plate type system in the prior art.
Figure 11:
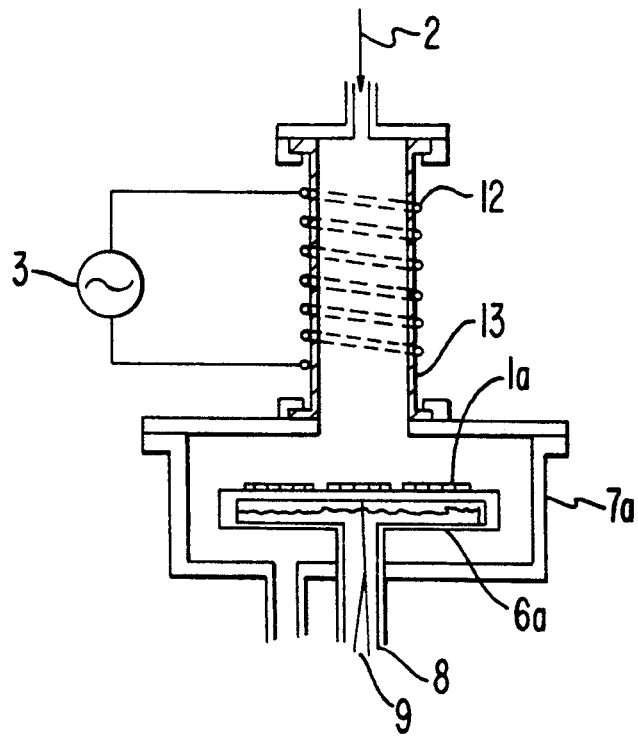
FIG. 11 is a schematic diagram in section of an induction coupling type system in the prior art.
Figure 12:
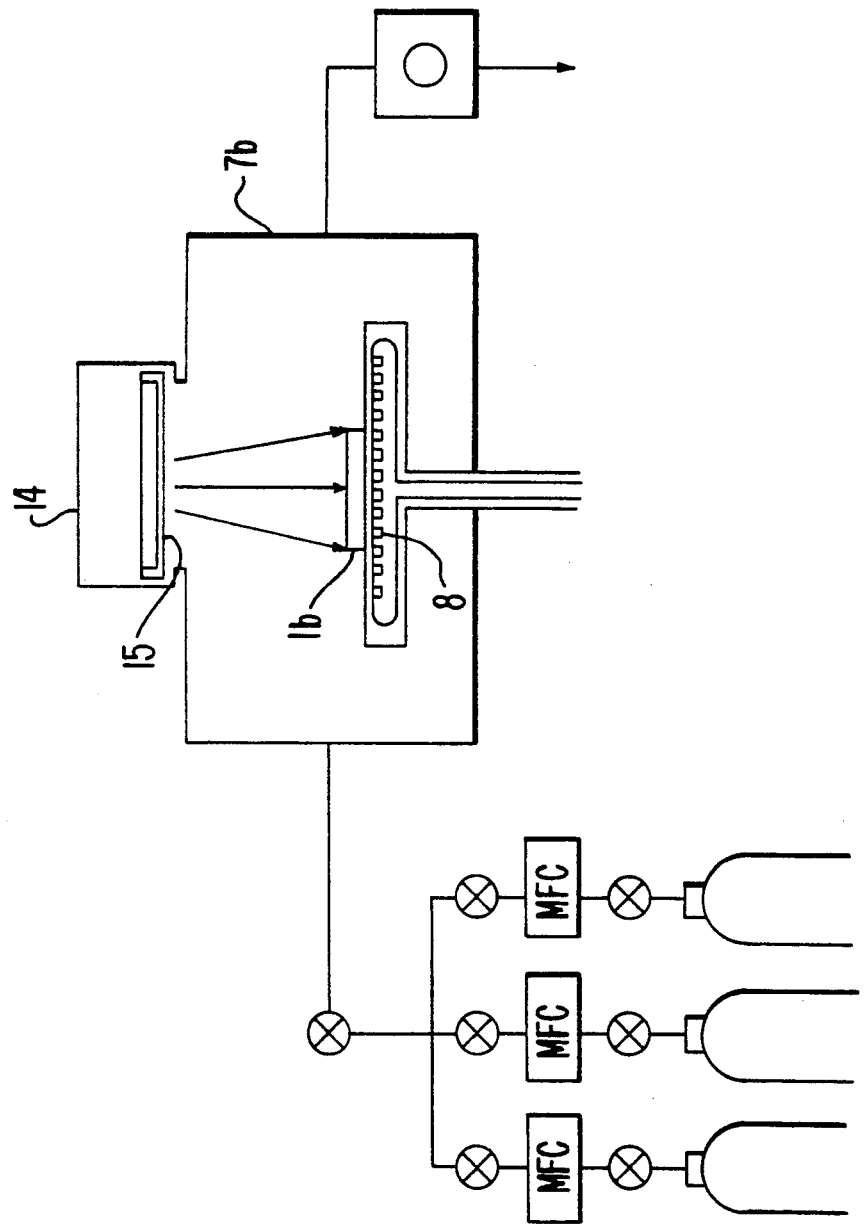
FIG. 12 is a schematic diagram in section of an optical type system in the prior art.

Now a fifth preferred embodiment of the present invention will be described with reference to FIG. 9. In this preferred embodiment, the vacuum container portion 21 of the first preferred embodiment is disposed in a coil 31 connected to an A.C. power supply 32 and having its axis directed horizontally. The coil 31 generates a A.C. magnetic field which intersects perpendicularly to the electric fields of the electromagnetic waves generated by the electrodes 24. Accordingly, particles of the plasma 29 produced within the container 21 are made to drift. Hence, the formation of a film by CVD on the substrates 22 is promoted, and the formed film is more uniform than when only the first embodiment is practiced.

As will be apparent from the detailed description of the preferred embodiments above, according to the present invention, since an electrode is not located within a vacuum container, neither particles peeled off from a formed film nor impurities released from an electrode will contaminate the formed film. In addition, the planar antenna type discharging electrodes can be used to form large and uniform thin film. Accordingly, the subject CVD system is extremely effective for manufacturing amorphous silicon solar cells, thin film semiconductors, photosensors, semiconductor protective films, etc.

While a principle of the present invention has been described above in connection with a number of preferred embodiments of the invention, it is intended that all matter contained in the above description and illustrated in the accompanying drawings be interpreted as illustrative of the invention and not in a limiting sense.

What is claimed is:

1. A plasma-chemical vapor-phase epitaxy system, comprising: a vacuum chamber having a window of a dielectric; a heater disposed within said chamber opposed to said window; an antenna disposed outside of said vacuum chamber opposed to said window, said antenna having at least one conductor element, all of the conductor elements of said antenna lying in a common plane and inscribing a rectangle; a high frequency power supply electrically inductively coupled to said antenna so as to supply electric power to said antenna; and a box of electromagnetic shielding material covering said antenna so as to shield each said at least one conductor from the outside of the system such that electromagnetic radiation discharged from the antenna is prevented from leaking to the outside of the system.

2. A plasma-chemical vapor-phase epitaxy system as claimed in claim 1, and further comprising a coil having a central axis extending perpendicular to the direction of an electric field of the radiation discharged from said antenna, and an A.C. power supply coupled to said coil so as to supply electrical power thereto such that the coil generates an A.C. magnetic field which will act on plasma produced in the vacuum chamber.

3. A plasma-chemical vapor-phase epitaxy system as claimed in claim 1, wherein said antenna has the shape of a ladder, and said at least one conductor element includes a plurality of conductor elements forming rungs of the ladder.

4. A plasma-chemical vapor-phase epitaxy system as claimed in claim 1, wherein said antenna has only one said conductor element, the one conductor element being a flat plate.

* * * * *